(12) United States Patent
Yoneta et al.

(10) Patent No.: US 9,754,995 B2
(45) Date of Patent: Sep. 5, 2017

(54) MANUFACTURING METHOD FOR SOLID-STATE IMAGING DEVICE AND SOLID-STATE IMAGING DEVICE

(71) Applicant: HAMAMATSU PHOTONICS K.K., Hamamatsu-shi, Shizuoka (JP)

(72) Inventors: Yasuhito Yoneta, Hamamatsu (JP); Ryoto Takisawa, Hamamatsu (JP); Shingo Ishihara, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 117 days.

(21) Appl. No.: 14/406,851

(22) PCT Filed: Feb. 21, 2013

(86) PCT No.: PCT/JP2013/054391
§ 371 (c)(1),
(2) Date: Dec. 10, 2014

(87) PCT Pub. No.: WO2013/187085
PCT Pub. Date: Dec. 19, 2013

(65) Prior Publication Data
US 2015/0137301 A1 May 21, 2015

(30) Foreign Application Priority Data

Jun. 15, 2012 (JP) .................................. 2012-136201

(51) Int. Cl.
*H01L 27/148* (2006.01)
*H01L 27/146* (2006.01)

(52) U.S. Cl.
CPC ........ *H01L 27/1469* (2013.01); *H01L 27/148* (2013.01); *H01L 27/1464* (2013.01);
(Continued)

(58) Field of Classification Search
CPC ............. H01L 27/1469; H01L 27/1464; H01L 27/14687; H01L 27/14636; H01L 27/14634; H01L 27/148
(Continued)

(56) References Cited

U.S. PATENT DOCUMENTS

2009/0298277 A1* 12/2009 MacKay ................ H01L 24/03
438/613

FOREIGN PATENT DOCUMENTS

CN        101425524        5/2009
JP        2000-349194      12/2000
(Continued)

OTHER PUBLICATIONS

English-language translation of International Preliminary Report on Patentability (IPRP) dated Dec. 24, 2014 that issued in WO Patent Application No. PCT/JP2013/054391.

*Primary Examiner* — Hoang-Quan Ho
(74) *Attorney, Agent, or Firm* — Drinker Biddle & Reath LLP

(57) ABSTRACT

A method for manufacturing a solid-state imaging device comprises a first step of preparing an imaging element including a second principal surface having an electrode arranged thereon, and a photoelectric converter part configured to photoelectrically convert the incident energy line so as to generate a signal charge; a second step of preparing a support substrate, provided with at least one through hole extending in a thickness direction thereof, having a third principal surface; a third step of aligning the imaging element and the support substrate with each other so that the
(Continued)

one electrode is exposed out of the one through hole while the second and third principal surfaces oppose each other and joining the imaging element and the support substrate to each other; and a fourth step of embedding a conductive member in the through hole after the third step.

10 Claims, 13 Drawing Sheets

(52) U.S. Cl.
 CPC .. *H01L 27/14634* (2013.01); *H01L 27/14636* (2013.01); *H01L 27/14687* (2013.01)
(58) Field of Classification Search
 USPC ..................................................... 438/57–98
 See application file for complete search history.

(56) References Cited

FOREIGN PATENT DOCUMENTS

| | | | |
|---|---|---|---|
| JP | 2004-057507 A | | 2/2004 |
| JP | 2004057507 A | * | 2/2004 |
| JP | 2005-108991 | | 4/2005 |
| JP | 2007-013089 A | | 1/2007 |
| JP | 2008-300613 A | | 12/2008 |
| JP | 2008300613 A | * | 12/2008 |
| JP | 2010-225778 | | 10/2010 |
| JP | 2011-086828 | | 4/2011 |
| WO | WO 2009/146373 | | 12/2009 |

\* cited by examiner

Fig.1
(a)
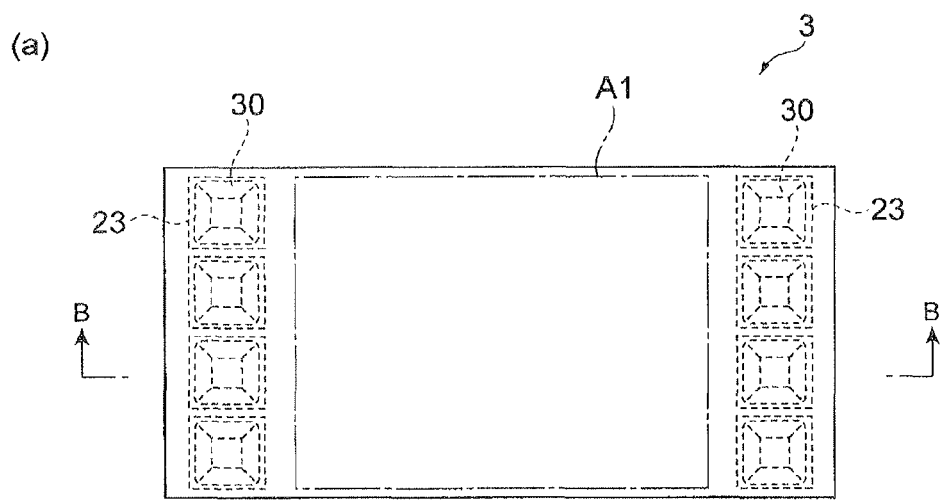
(b)
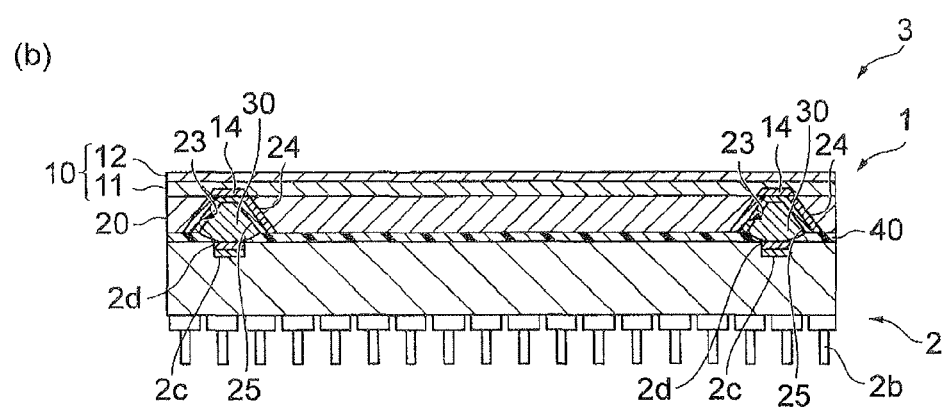

Fig.4
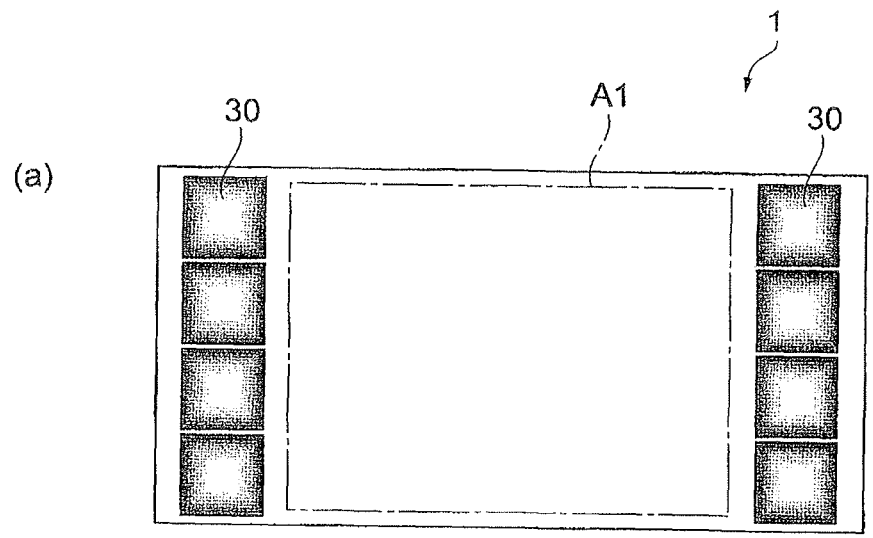
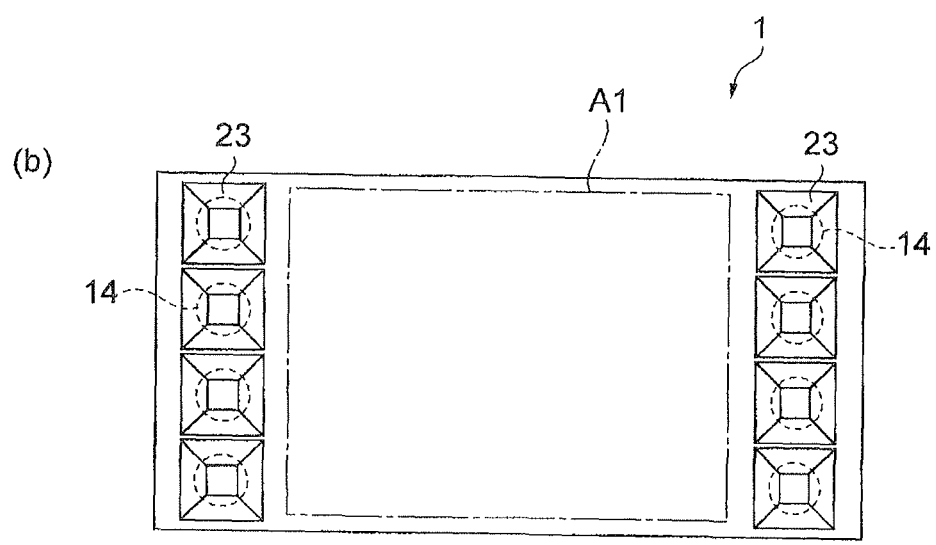

MANUFACTURING METHOD FOR SOLID-STATE IMAGING DEVICE AND SOLID-STATE IMAGING DEVICE

TECHNICAL FIELD

The present invention relates to a method for manufacturing a solid-state imaging device and the solid-state imaging device.

BACKGROUND ART

Patent Literature 1 discloses a back-illuminated solid-state imaging device using a CMOS image sensor (hereinafter referred to as "sensor"). This solid-state imaging device comprises a support substrate having a pair of principal surfaces opposing each other and a sensor disposed on one principal surface of the support substrate. The support substrate has a through electrode extending in its thickness direction and penetrating therethrough. One end part of the through electrode is electrically connected to an electrode of the sensor. The other end part of the through electrode is exposed at the other principal surface of the support substrate. In a state where the solid-state imaging device is mounted on an IC chip for signal processing, the other end part of the through electrode is electrically connected to an electrode of the IC chip through a bump electrode.

The method for manufacturing the above-mentioned solid-state imaging device includes the steps of joining the sensor to the support substrate, forming a resist pattern on the other principal surface of the support substrate, etching the support substrate from the other principal surface side so as to form a through hole, and filling the through hole with a metal so as to form the through electrode.

CITATION LIST

Patent Literature

Patent Literature 1: Japanese Patent Application Laid-Open No. 2007-13089

SUMMARY OF INVENTION

Technical Problem

It is necessary for the above-mentioned back-illuminated solid-state imaging device to make the sensor as thin as possible so as to enhance its light-receiving sensitivity, since light or various energy lines (e.g., UV rays, electron beams, radiations, charged particle beams, and the like) enter the sensor from the back side. However, the sensor reduces its mechanical strength as it is made thinner, thereby becoming harder to handle.

For securing the mechanical strength, the sensor may partly be made thinner at its light-receiving part, while letting thicker outer edge parts surround the light-receiving part. However, the presence of the outer edge parts makes the area of the light-receiving part relatively small with respect to the area of the sensor, thereby lowering the light-receiving efficiency per unit area of the sensor. For enhancing the light-receiving efficiency by thinning the whole surface of the sensor while securing its mechanical strength, the above-mentioned solid-state imaging device does not use the sensor by itself but joins it to the support substrate.

The above-mentioned solid-state imaging device electrically connects the sensor and the IC chip to each other by using the through electrode. This makes it unnecessary to use wire bonding for electrically connecting the sensor and the IC chip to each other and thus can achieve a smaller size.

However, it takes a high degree of technical difficulty to provide the support substrate with the through hole after joining the sensor and the support substrate to each other, which may lower the yield.

It is an object of the present invention to provide a method for manufacturing a solid-state imaging device which enables easy manufacture and the solid-state imaging device.

Solution to Problem

The method for manufacturing a solid-state imaging device in accordance with one aspect of the present invention comprises a first step of preparing an imaging element including a first principal surface for receiving an energy line incident thereon, a second principal surface opposing the first principal surface and having at least one electrode arranged thereon, and a photoelectric converter part for photoelectrically converting the incident energy line so as to generate a signal charge; a second step of preparing a support substrate, provided with at least one through hole extending in a thickness direction thereof, having third and fourth principal surfaces opposing each other; a third step of aligning the imaging element and the support substrate with each other so that the one electrode is exposed out of the one through hole while the second and third principal surfaces oppose each other and joining the imaging element and the support substrate to each other; and a fourth step of embedding a conductive member in the through hole after the third step.

In the method for manufacturing a solid-state imaging device in accordance with this aspect of the present invention, the conductive member is embedded in the through hole of the support substrate joined to the imaging element. Therefore, the electrical connection step is easy when manufacturing the solid-state imaging device. Hence, the solid-state imaging device can be manufactured easily, and the yield can be improved.

The fourth step may include the steps of arranging an electrically conductive first conductor in the through hole and melting the first conductor, so as to embed the conductive member in the through hole. In this case, the solid first conductor is molten while being arranged in the through hole, whereby the conductive member will hardly protrude from the through hole as compared with the case where a conductive material in a molten state is caused to flow into the through hole.

The first conductor may be a solder ball. This makes it easy to arrange the first conductor in the through hole.

The fourth step may include the steps of arranging an electrically conductive first conductor in the through hole, melting the first conductor, then arranging an electrically conductive second conductor in the through hole, and melting the second conductor, so as to embed the conductive member in the through hole. In this case, the solid first and second conductors are molten while being arranged in the through hole, whereby the conductive member will hardly protrude from the through hole as compared with the case where a conductive material in a molten state is caused to flow into the through hole. Using a large conductor in order to embed the conductive member in the through hole at once may leave bubbles in the conductive member. By contrast, arranging an electrically conductive first conductor in the through hole, melting the first conductor, then arranging an electrically conductive second conductor in the through hole, and melting the second conductor embeds the conductive member separately in two parts, whereby the fear of leaving bubbles in the conductive material becomes very small.

Both of the first and second conductors may be solder balls. In this case, the first and second conductors can easily be arranged in the through hole.

The electrode may be formed with a plating film after the third step but before the fourth step. In this case, the conductive member is connected more securely to the electrode through the plating film.

The through hole may be formed such that the diameter thereof increases as the through hole extends from the third principal surface to the fourth principal surface. This makes it easier to embed the conductive member in the through hole in the third step.

The through hole may have an inner wall surface formed with a metal film. This enables the inner wall surface of the through hole to be formed with a plating film as well.

The electrode and second principal surface of the imaging element prepared by the first step may be covered with a flattening film, and the flattening film may partly be removed so as to expose at least a part of a surface of the electrode after the third step but before the fourth step. In this case, the surface of the imaging element is flattened by the flattening film, whereby the joint between the imaging element and the support substrate becomes more secure.

The solid-state imaging device in accordance with another aspect of the present invention comprises an imaging element including a first principal surface for receiving an energy line incident thereon, a second principal surface opposing the first principal surface and having at least one electrode arranged thereon, and a photoelectric converter part for photoelectrically converting the incident energy line so as to generate a signal charge; a support substrate, provided with a through hole extending in a thickness direction thereof, having third and fourth principal surfaces opposing each other, the support substrate being joined to the imaging element so that one electrode is exposed out of one through hole while the second and third principal surfaces oppose each other; and a conductive member embedded in the through hole and electrically connected to each electrode.

The solid-state imaging device in accordance with this aspect of the present invention is manufactured by embedding the conductive member in the through hole of the support substrate joined to the imaging element and electrically connecting the conductive member and the electrode to each other. Therefore, the electrical connection step is easy when manufacturing the solid-state imaging device. Hence, the solid-state imaging device can be manufactured easily, and the yield can be improved.

The electrode may be formed with a plating film. In this case, the conductive member is connected more securely to the electrode through the plating film.

The through hole may be formed such that the diameter thereof increases as the through hole extends from the third principal surface to the fourth principal surface. This makes it easier to embed the conductive member in the through hole when manufacturing the solid-state imaging device.

The through hole may have an inner wall surface formed with a metal film. This enables the inner wall surface of the through hole to be formed with a plating film as well.

A flattening film covering the second principal surface may further be provided, and at least a part of a surface of the electrode may be exposed out of the flattening film. In this case, the surface of the imaging element is flattened by the flattening film, whereby the joint between the imaging element and the support substrate becomes more secure.

Advantageous Effects of Invention

Various aspects of the present invention can provide a method for manufacturing a solid-state imaging device which enables easy manufacture and the solid-state imaging device.

BRIEF DESCRIPTION OF DRAWINGS (a) of FIG. 1 is a top plan view of an electronic component in accordance with an embodiment, while (b) of FIG. 1 is a sectional view taken along the line B-B of (a) of FIG. 1;

Figure 5:
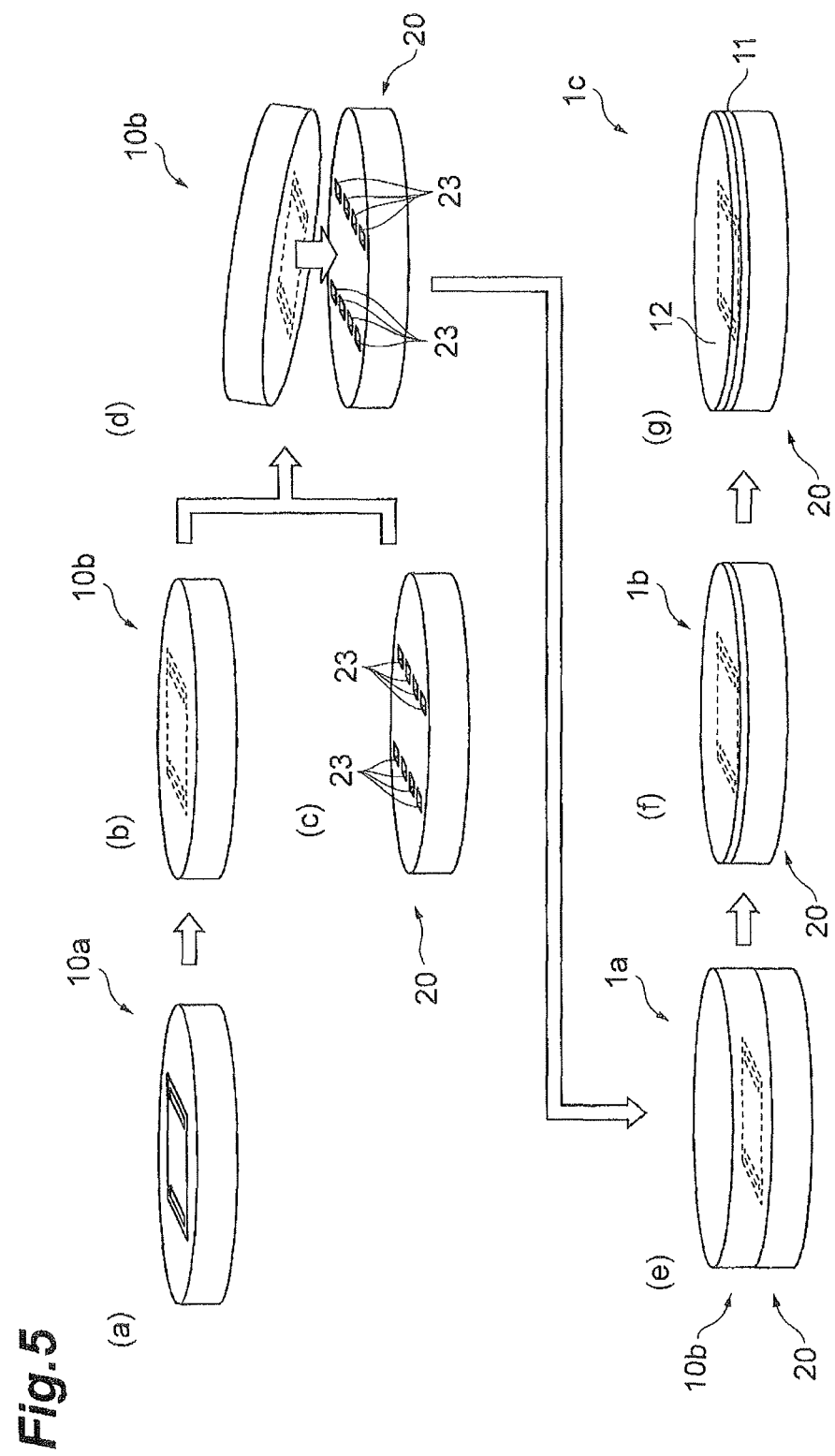
Figure 6:
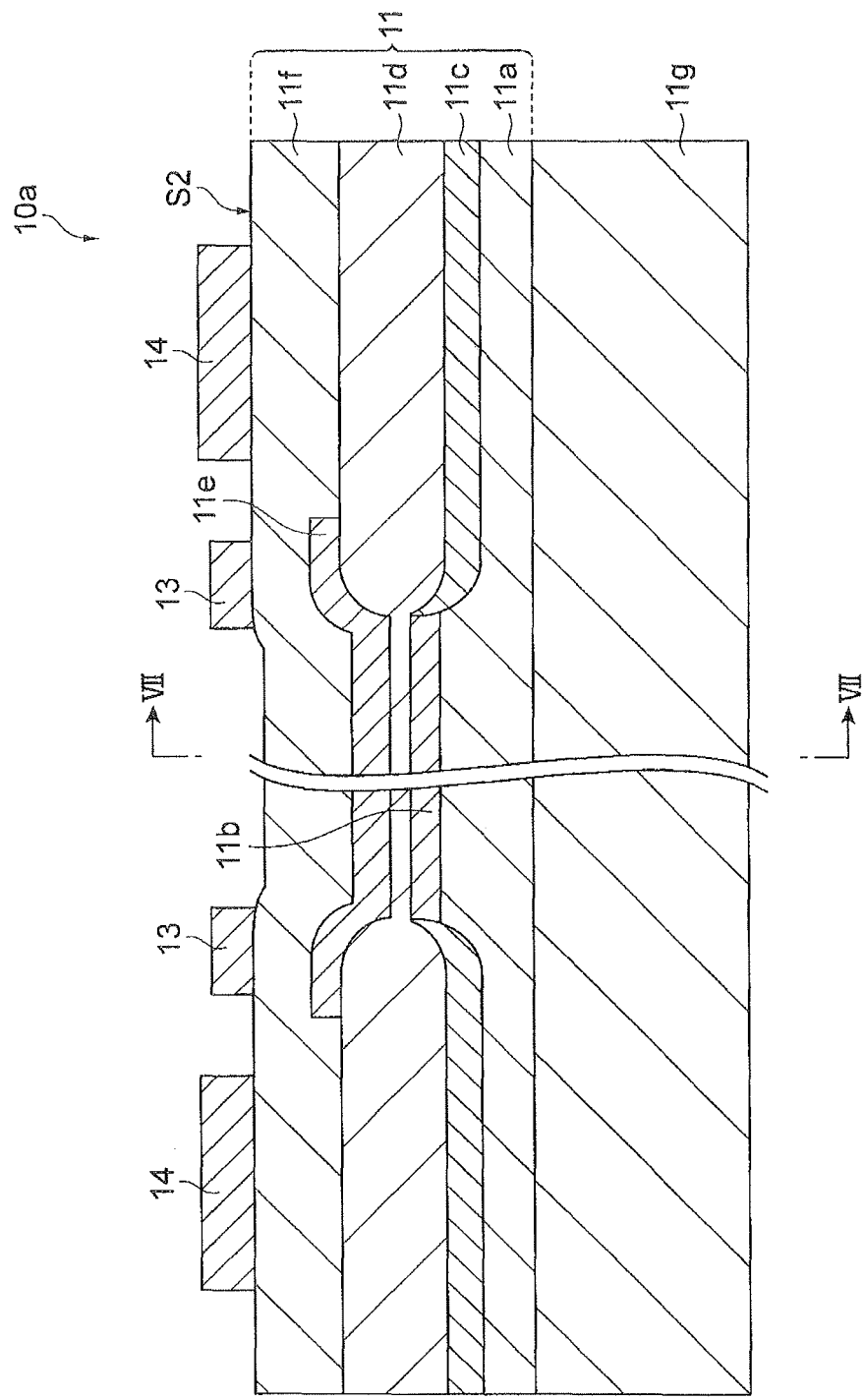
Figure 7:
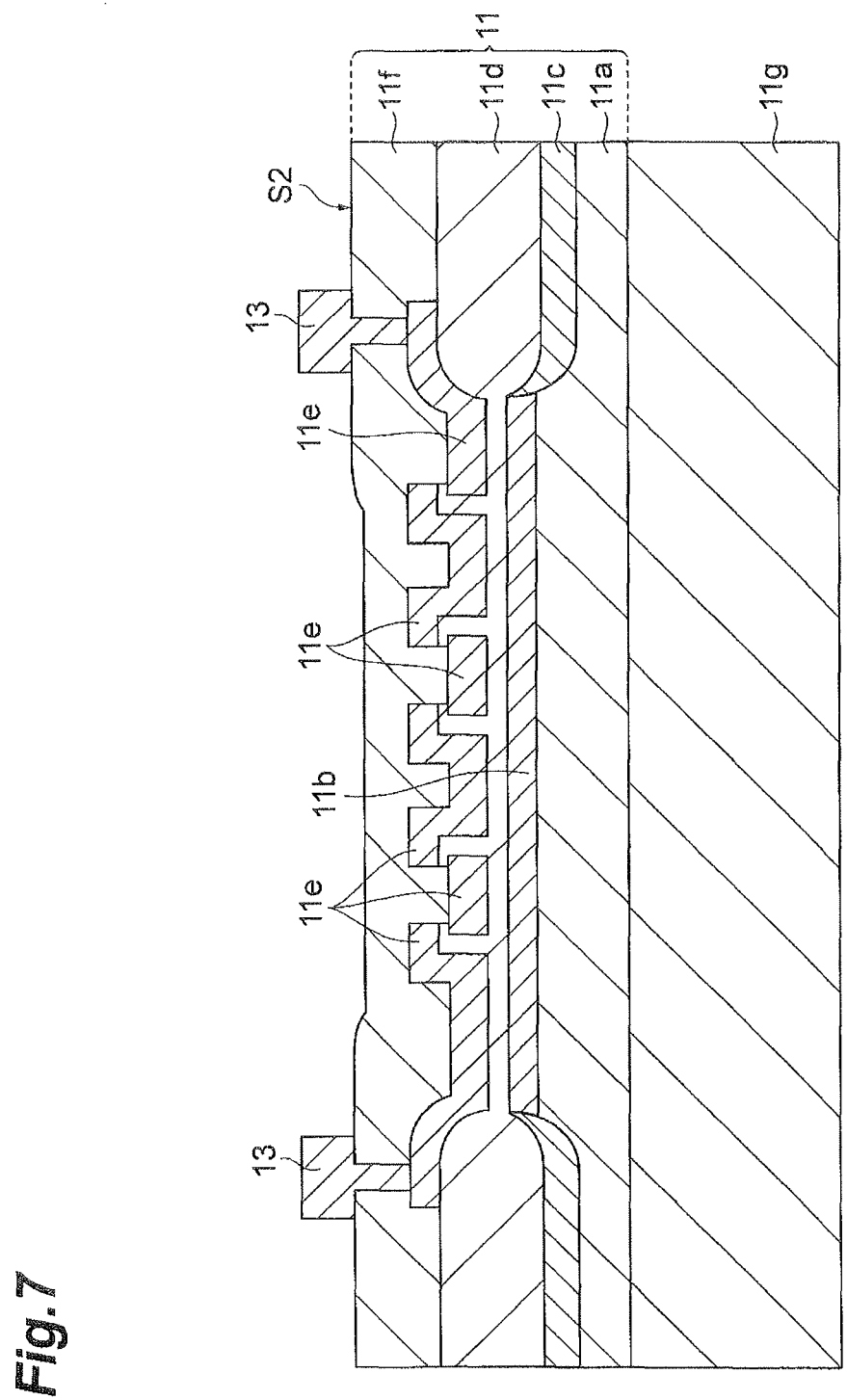
Figure 8:
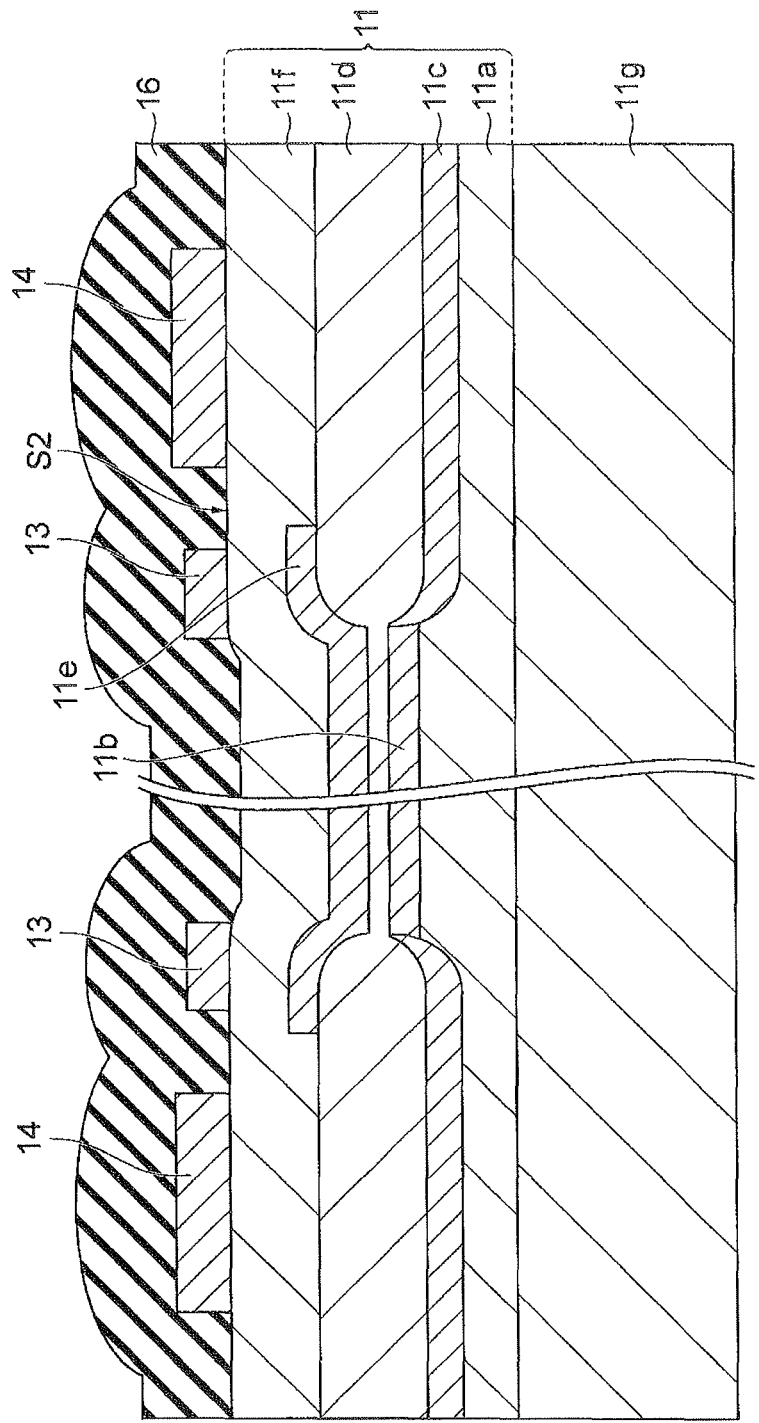
Figure 9:
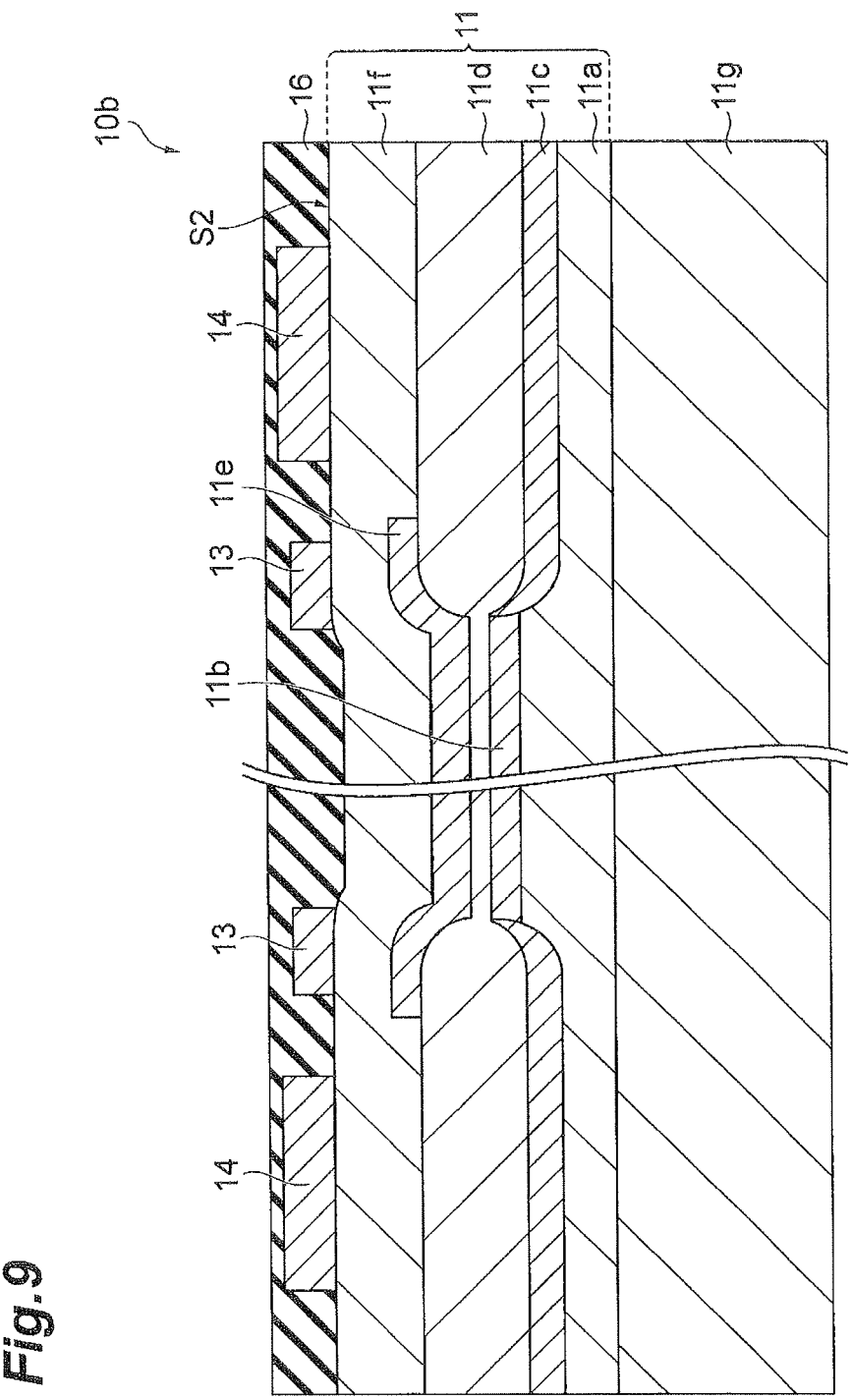
Figure 10:
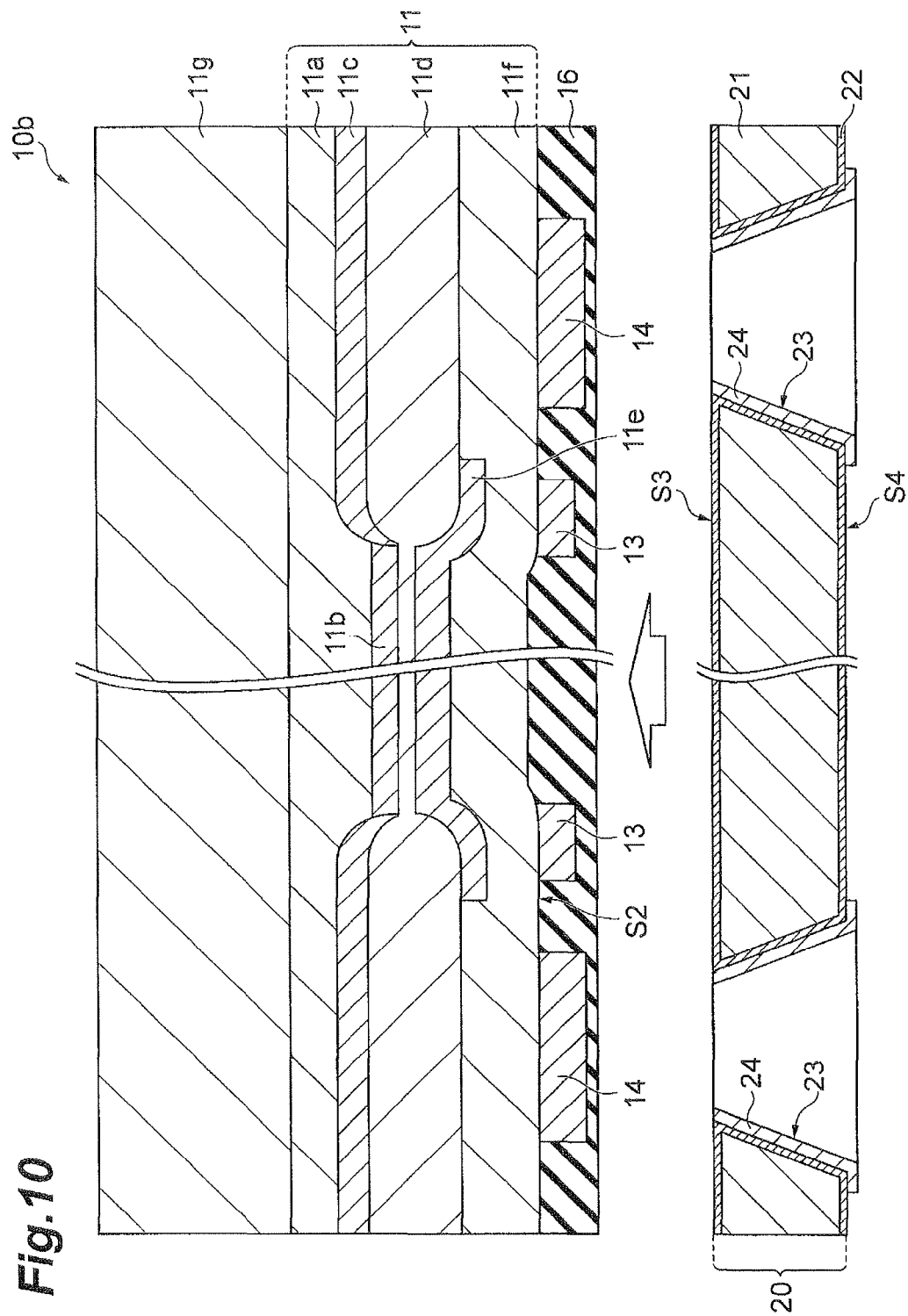
Figure 11:
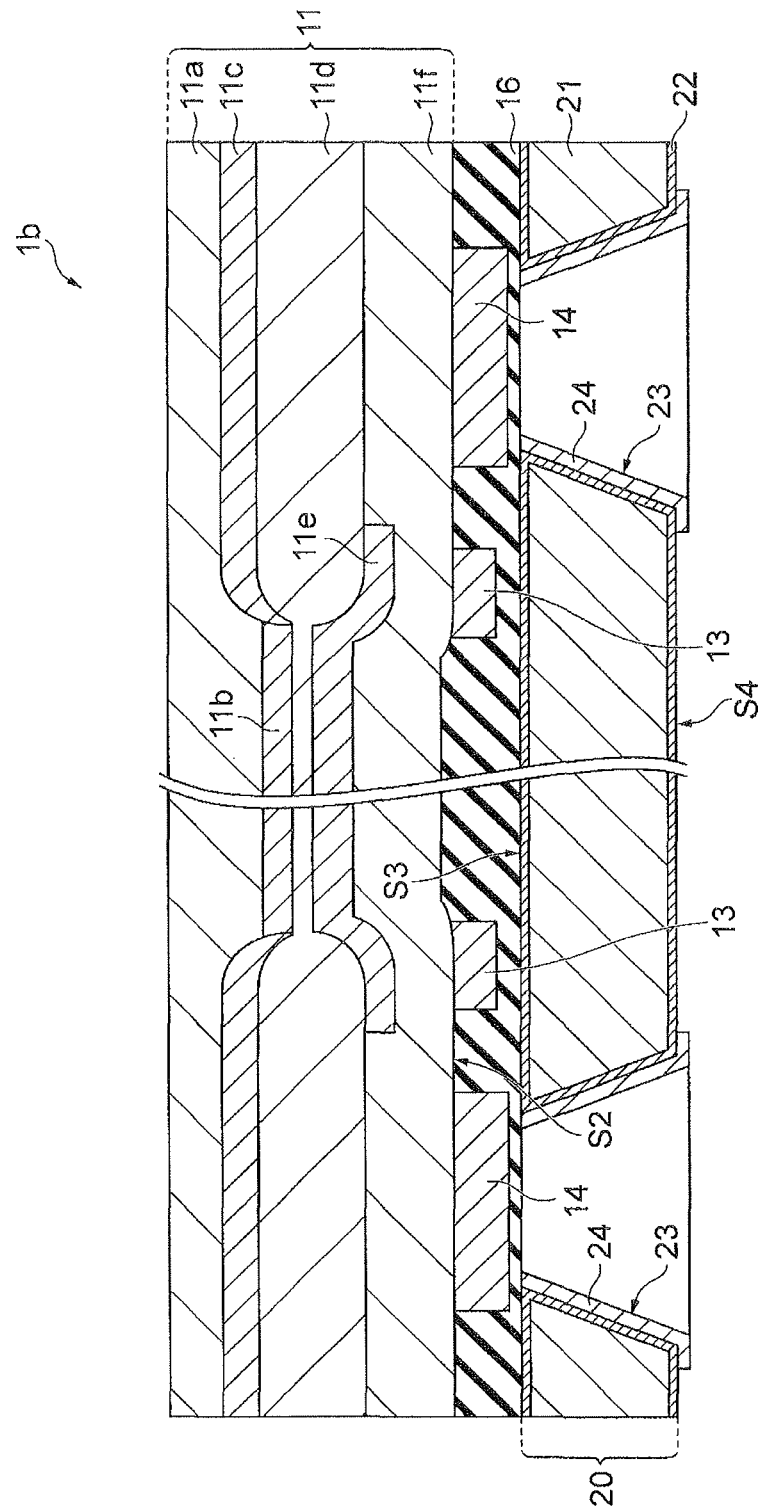
Figure 12:
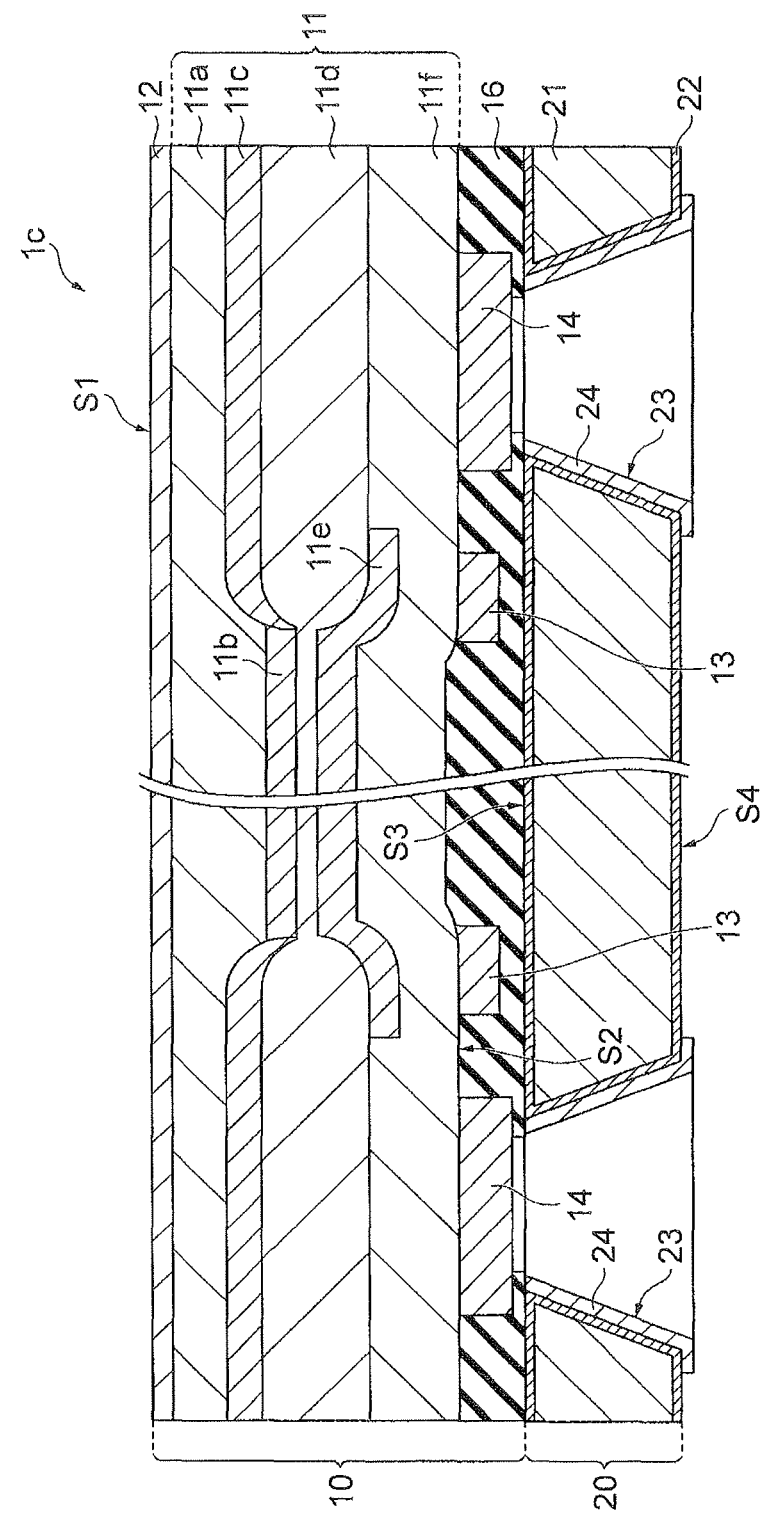
Figure 13:
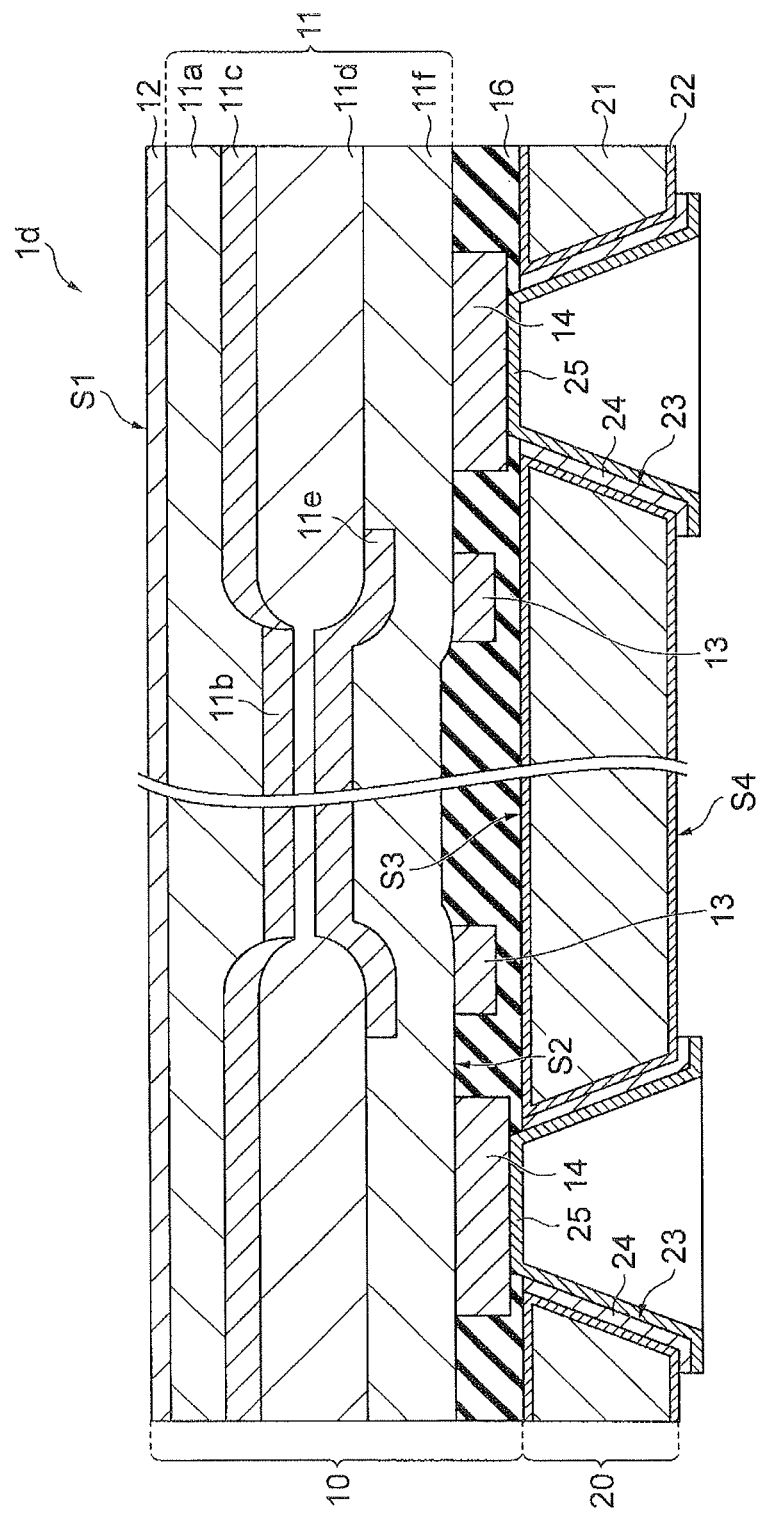

(a) of FIG. 4 is a diagram illustrating the solid-state imaging device in accordance with the embodiment as seen from its support substrate side, while (b) of FIG. 4 is a diagram illustrating a state where conductive members are removed from (a) of FIG. 4;

FIG. 5 is a diagram illustrating a step of manufacturing the solid-state imaging device in accordance with the embodiment;

FIG. 6 is a diagram illustrating a step of manufacturing the solid-state imaging device in accordance with the embodiment;

FIG. 7 is a sectional view taken along the line VII-VII of FIG. 6;

FIG. 8 is a diagram illustrating a step of manufacturing the solid-state imaging device in accordance with the embodiment;

FIG. 9 is a diagram illustrating a step of manufacturing the solid-state imaging device in accordance with the embodiment;

FIG. 10 is a diagram illustrating a step of manufacturing the solid-state imaging device in accordance with the embodiment;

FIG. 11 is a diagram illustrating a step of manufacturing the solid-state imaging device in accordance with the embodiment;

FIG. 12 is a diagram illustrating a step of manufacturing the solid-state imaging device in accordance with the embodiment; and FIG. 13 is a diagram illustrating a step of manufacturing the solid-state imaging device in accordance with the embodiment.

DESCRIPTION OF EMBODIMENTS

In the following, an embodiment of the present invention will be explained in detail with reference to the drawings. In the explanation, the same constituents or those having the same functions will be referred to with the same signs while omitting their overlapping descriptions.

With reference to FIGS. 1 to 4, the structure of an electronic component 3 in which a solid-state imaging device 1 in accordance with the embodiment is mounted on an IC chip 2 will be explained. As illustrated in FIG. 1, the solid-state imaging device 1 comprises a back-illuminated imaging element 10 of a CCD type, a support substrate 20 for supporting the imaging element 10, and a plurality of conductive members 30.

Figure 2:
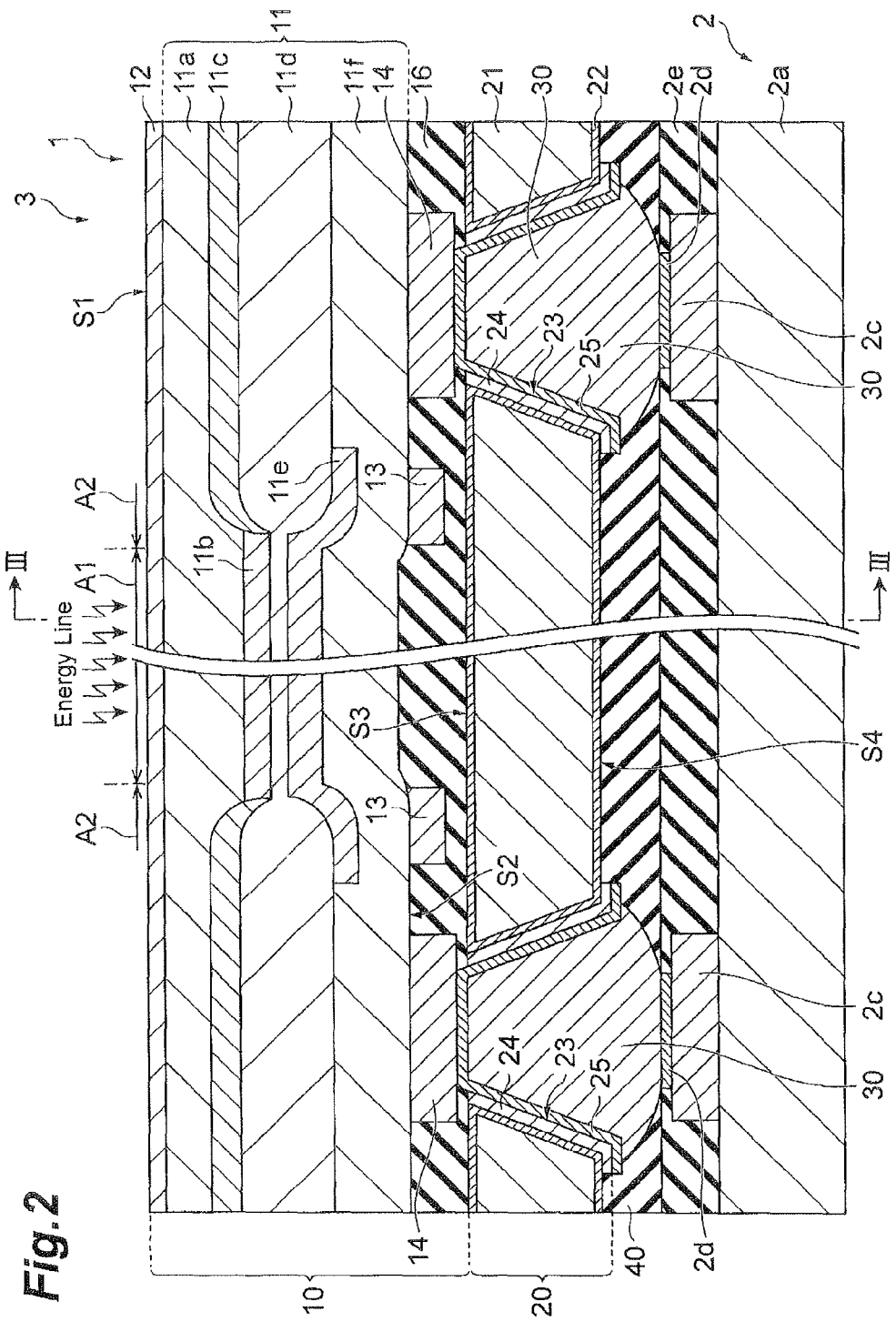
FIG. 2 is a sectional view of the electronic component in accordance with the embodiment, illustrating (b) of FIG. 1 in more detail under magnification.

As illustrated in FIG. 2, the imaging element 10 has an element body 11, an AR coat 12, wiring 13, and a plurality of electrodes 14. The element body 11 includes a p-type semiconductor layer 11a, an n-type semiconductor layer 11b, a p+-type semiconductor layer 11c, an insulating layer 11d, electrode films 11e, and an interlayer insulating layer 11f.

The p-type semiconductor layer 11a has a protruded part thicker than the remaining part. The n-type semiconductor layer 11b is formed with a predetermined thickness on the protruded part. A p-n junction is formed at an interface between the p-type semiconductor layer 11a and the n-type semiconductor layer 11b. The vicinity of the interface functions as a photoelectric converter part, so as to photoelectrically convert various energy lines (e.g., light, UV rays, electron beams, radiations, charged particle beams, and the like) enter the interface, thereby generating signal charges.

The p+-type semiconductor layer 11c is arranged so as not to cover principal surfaces of the n-type semiconductor layer 11b but side faces of the n-type semiconductor layer 11b and a surface of the p-type semiconductor layer 11a. The insulating layer 11d is arranged so as to cover a principal surface of the n-type semiconductor layer 11b and a surface of the p+-type semiconductor layer 11c. The insulating layer 11d is constituted by $SiO_2$ or the like, for example. In the insulating layer 11d, the part covering the principal surface of the n-type semiconductor layer 11b is thinner than the part covering the surface of the p+-type semiconductor layer 11c.

Figure 3:
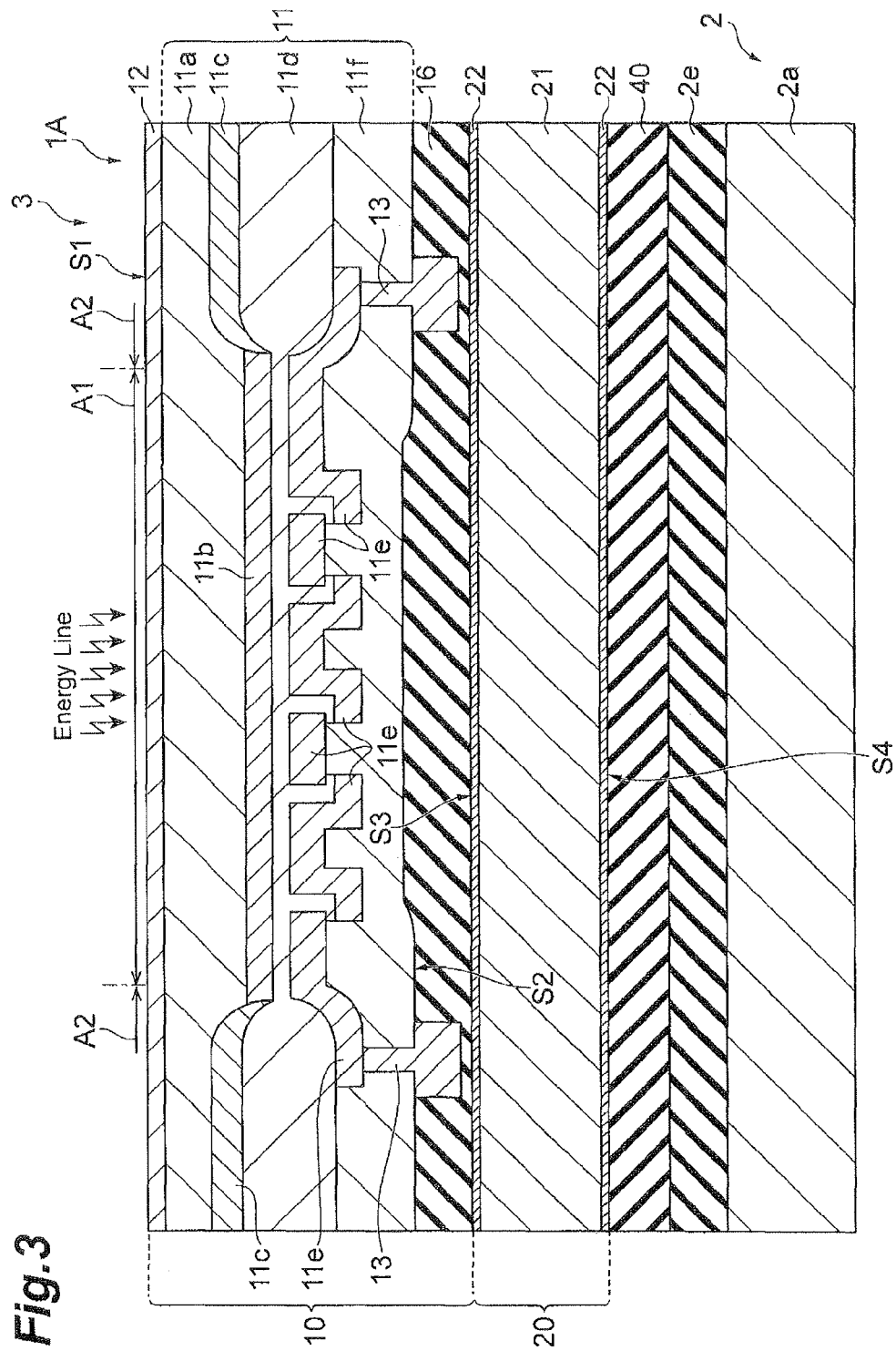
FIG. 3 is a sectional view taken along the line III-III of FIG. 2.

As illustrated in FIG. 2, each electrode film 11e is a belt-like film extending so as to cover the thin part of the insulating layer 11d and its vicinity. As illustrated in FIG. 3, a plurality of electrode films 11e are arranged in a row in the width direction of the imaging element 10. The electrode films 11e adjacent to each other are insulated from each other by the insulating film and have their end parts overlapping each other as seen in the thickness direction of the imaging element 10. The electrode films 11e are constituted by poly-Si, for example. The interlayer insulating layer 11f is arranged so as to cover the electrode films 11e and insulating layer 11d. The interlayer insulating layer 11f is constituted by boronphosphosilicate glass (BPSG) or the like, for example.

The AR coat 12 functions to prevent light in a predetermined wavelength band from being reflected. The AR coat 12 is constituted by $SiO_2$, SiN or the like, for example. The AR coat 12 is formed on a surface of the p-type semiconductor layer 11a. The wiring 13 and electrodes 14 are patterned on a surface of the interlayer insulating layer 11f (a principal surface S2 of the photoelectric converter part 11). The wiring 13 and electrodes 14 are constituted by Al or the like, for example. The wiring 13 and electrodes 14 have their thicknesses set on the order of 0.1 μm to 1 μm, for example. As illustrated in (b) of FIG. 4, a plurality of electrodes 14 (five electrodes 14 in this embodiment) are arranged in one row each on both sides of a light detection area A1 as seen in the opposing direction of principal surfaces S1, S2.

In thus constructed imaging element 10, a region where the p-type semiconductor layer 11a, n-type semiconductor layer 11b, insulating layer 11d, and electrode films 11e are stacked functions as the light detection area A1, while the other region functions as a wiring area A2. The surface on the AR coat 12 side of the imaging element 10 functions as the principal surface S1 on which the energy line enters. The surface on the interlayer insulating layer 11f side of the imaging element 10 functions as the principal surface S2 opposing the support substrate 20.

As illustrated in FIG. 2, a flattening film 16 is disposed on the principal surface S2 of the imaging element 10. The flattening film 16 is arranged so as to cover the interlayer insulating layer 11f, wiring 13, and a part of the electrodes 14. Therefore, the flattening film 16 flattens the surface of the interlayer insulating layer 11f that is irregular due to the presence of the wiring 13 and electrodes 14. The flattening film 16 is constituted by TEOS (tetraethoxysilane) or the like, for example.

As illustrated in FIG. 1, the support substrate 20 is joined to the imaging element 10 through the flattening film 16. As illustrated in FIG. 2, the support substrate 20 has a substrate 21 and an insulating film 22 covering all the surfaces of the substrate 21. The substrate 21 is constituted by Si, for example. The insulating film 22 is constituted by an oxide film formed by thermal oxidation or the like, for example.

The support substrate 20 is formed with through holes 23, extending in its thickness direction, by the same number as with the electrodes 14. In this embodiment, eight through holes 23 are formed. As illustrated in (a) of FIG. 1 and FIG. 4, the through holes 23 are arranged four by four on both sides as seen in the opposing direction of the principal surfaces S1, S2. As illustrated in (b) of FIG. 4, a part of the electrode 14 is exposed out of each through hole 23. As with the surfaces of the substrate 21, each through hole 23 is covered with the insulating film 22. That is, the support substrate 20 is provided with the through holes 23 extending in its thickness direction and having their inner wall surfaces covered with the insulating film.

As illustrated in (b) of FIG. 1 and FIG. 2, each through hole 23 is formed such that the diameter thereof increases as the through hole 23 extends from one principal surface S3 of the support substrate to the other principal surface S4. That is, the inner wall surface of each through hole 23 is tapered. The openings of the through hole 23 are square on both sides of the principal surfaces S3, S4.

A metal film 24 to become a foundation for a plating film 25 which will be explained later is provided on the inner wall surface of each through hole 23 and on the vicinity of the opening on the principal surface S4 side of each through hole 23. The metal film 24 is constituted by Al or the like, for example.

The part not covered with the flattening film 16 in each electrode 14 and the surface of the metal film 24 are formed with the plating film 25. The plating film 15 is constituted by Au, Ni or the like, for example.

The conductive members 30 are made of an electrically conductive metal and constituted by solder, for example. As illustrated in FIGS. 1 and 2, and (a) of FIG. 4, the conductive member 30 is embedded in each through hole 23. That is, each conductive member 30 is arranged in its corresponding through hole 23. The conductive members 30 correspond to the electrodes 14 and plating films 15 individually and are electrically connected to the respective electrodes 14 and plating films 15.

As illustrated in (b) of FIG. 1 and FIG. 2, the IC chip 2 has a chip body 2a, a plurality of lead terminals 2b, electrodes 2c, plating films 2d, and an insulating film 2e. The chip body 2a carries out signal processing of electric signals outputted from the imaging element 10, operation control of the imaging element 10, and the like. The plurality of lead terminals 2b extend from the chip body 2a and are electrically connected to electrodes of an undepicted circuit substrate or the like when the IC chip 2 is mounted on the latter.

The electrodes 2c are patterned on the chip body 2a. The electrodes 2c are constituted by Al or the like, for example. In this embodiment, the plating films 2d are arranged on a part of principal surfaces of the electrodes 2c. The plating films 2d are constituted by Au, Ni or the like, for example. The insulating film 2e is formed so as to expose principal surfaces of the plating film 2d but cover the chip body 2a and electrodes 2c. The insulating film 2e is constituted by $SiO_2$ or the like, for example.

For reliably securing the solid-state imaging device 1 and the IC chip to each other, a resin material 40 fills the interstices between the solid-state imaging device 1 and the IC chip 2. As the resin material, an epoxy resin or the like can be used, for example.

With reference to FIGS. 2, 3, and 5 to 13, a method for manufacturing the electronic component 3 equipped with this solid-state imaging device 1 in accordance with the embodiment will now be explained. First, as illustrated in (a) of FIG. 5 and FIG. 6, a precursor 10a for the imaging element 10 is produced. Specifically, as illustrated in FIG. 6, a so-called epi-wafer in which the p-type semiconductor layer 11a is epitaxially grown on a surface of a p+ semiconductor substrate 11g is prepared at first. The thickness of the substrate 11g is about 620 µm, for example, while the thickness of the p-type semiconductor layer 11a is 10 µm to 30 µm, for example.

Next, by so-called LOCOS process, p-type impurities are added onto the epi-wafer (p-type semiconductor layer 11a) by ion implantation using an $Si_3N_4$ film (not depicted) as a mask, so as to form the p+-type semiconductor layer 11c. Subsequently, using the same $Si_3N_4$ film as a mask, the insulating layer 11d is formed by oxidation. After removing the $Si_3N_4$ film, the n-type semiconductor layer 11b is formed by adding n-type impurities by ion implantation, and the electrode films 11e and the interlayer insulating layer 11f are layered thereon in this order. At this time, a plurality of belt-like electrode films 11e are formed so that end parts of the electrode films 11e adjacent to each other overlap as seen in the thickness direction of the imaging element 10 (see FIG. 7). This forms the element body 11 on the substrate 11g. Then, the wiring 13 and electrodes 14 are patterned on the interlayer insulating layer 11f (principal surface S2). Thus, the precursor 10a for the imaging element 10 illustrated in (a) of FIG. 5 and FIG. 6 is formed.

Subsequently, as illustrated in FIG. 8, the flattening film 16 is formed on the interlayer insulating layer 11f (on the principal surface S2) so as to cover the wiring 13 and electrodes 14. The thickness of the flattening film 16 can be set on the order of 1 µm to 5 µm, for example. Then, as illustrated in FIG. 9, the surface of the flattening film 16 is flattened by chemical mechanical polishing (CMP). This forms a precursor 10b for the imaging element 10 illustrated in (b) of FIG. 5 and FIG. 9. At this time, the wiring 13 and electrodes 14 are still covered with the flattening film 16.

Next, as illustrated in (c) of FIG. 5, the support substrate 20 provided with the through holes 23 is prepared. Here, by thermal oxidation or the like, the inner wall surface of each through hole 23 is formed with a high-quality oxide film having a uniform thickness. Then, as illustrated in (d) of FIG. 5 and FIG. 10, the precursor 10b for the imaging element 10 and the support substrate 20 are aligned with each other so that the principal surfaces S2, S3 oppose each other while exposing one electrode 14 out of one through hole 23, and the precursor 10b and the support substrate 20 are joined to each other. The precursor 10b and the support substrate 20 may be joined to each other either directly by ambient temperature bonding while pressing them against each other or with an adhesive (not depicted) such as a resin applied to the principal surface S2 of the precursor 10b, for example. This forms a precursor 1a for the solid-state imaging device 1 as illustrated in (e) of FIG. 5.

Subsequently, the substrate 11g in the precursor 1a is removed by etching, polishing, or the like, so as to expose the p-type semiconductor layer 11a. Here, the thickness from the p-type semiconductor layer 11a to the flattening film 16 is set on the order of 10 µm to 30 µm, for example. This forms a precursor 1b for the solid-state imaging device 1 illustrated in (f) of FIG. 5 and FIG. 11. Then, the AR coat 12 is formed on a surface of the p-type semiconductor layer 11a in the precursor 1b for the solid-state imaging device 1. Thereafter, areas to be formed with the plating films 15 in the electrodes 14 are exposed by etching with a resist or the like. This forms a precursor 1c for the solid-state imaging device 1 illustrated in (g) of FIG. 5 and FIG. 12.

Next, the plating film 25 is formed so as to cover the exposed electrodes 14 and the metal films 24 on the inner wall surfaces of the support substrate 20. This forms a precursor 1d for the solid-state imaging device 1 illustrated in FIG. 13. Subsequently, spherical solder balls (not depicted) are arranged individually in the through holes 23 and then molten by reflow, so as to embed the solder in each through hole 23. If the solder ball is too big for the through hole 23 at this time, the space occurring between the solder ball and the through hole 23 may become so large that bubbles occur in the solder when the solder ball is molten by reflow. It is therefore preferable for the solder ball to have such a size as to come into the part of the plating film 15 covering the electrode 14 when arranged in the through hole 23.

Thereafter, solder balls are arranged individually in the through holes 23 again and then molten by reflow, so as to embed the solder in each through hole 23. As a consequence, the solder fills each through hole 23, thereby forming the conductive members 30. This completes the solid-state imaging device 1.

Next, the solid-state imaging device 1 is mounted on the IC chip 2. Specifically, the conductive members 30 and the electrodes 2c of the IC chip 2 are aligned with each other and joined to each other by flip-chip bonding. As a consequence, the solid-state imaging device 1 and the IC chip 2 are electrically connected to each other through the conductive members 30. Then, the resin material 40 is caused to fill the interstices between the solid-state imaging device 1 and the IC chip 2. This completes the electronic component 3 illustrated in FIG. 2.

In thus configured embodiment, the conductive members 30 are embedded in the through holes 23 of the support substrate 20 joined to the imaging element 10, and the conductive members 30 and the electrodes 14 are electrically connected to each other. Therefore, the electrical connection step is easy when manufacturing the solid-state imaging device 1. Hence, the solid-state imaging device 1 can be manufactured easily, and the yield can be improved.

Meanwhile, the conventional method for manufacturing a solid-state imaging device includes the steps of joining a sensor to a support substrate, forming a resist pattern on the other principal surface of the support substrate, forming a through hole by etching the support substrate from the other principal surface side, and forming a through electrode by filling the through hole with a metal. For securing insulation between the support substrate (the inner wall surface of the through hole) and the electrode when forming the electrode in the through hole, it is necessary for a high-quality oxide film having a uniform thickness to be formed on the inner wall surface of the through hole by a method such as CVD (Chemical Vapor Deposition) or the like, for example. In this case, however, it takes a high degree of difficulty to obtain an insulating film with a sufficient quality, whereby reliability is hard to secure.

By contrast, this embodiment can prepare a high-quality oxide film having a uniform thickness beforehand on the inner wall surfaces of the through holes 23 of the support substrate 20 by thermal oxidation or the like. Therefore, sufficient insulation can be secured between the support substrate 20 (the inner wall surfaces of the through holes 23) and the electrodes, whereby the highly reliable solid-state imaging device 1 can be obtained.

This embodiment may arrange the first solder ball in the through hole 23, melt the solder ball, then arrange the second solder ball in the through hole 23, and melt this solder ball, thereby embedding the conductive member 30 in the through hole 23. In this case, the solid solder balls are molten while being arranged in the through hole 23, whereby the conductive member 30 will hardly protrude from the through hole 23 as compared with the case where a conductive material in a molten state is caused to flow into the through hole 23. Using a large solder ball in order to embed the conductive member in the through hole at once may leave bubbles in the conductive member. By contrast, this embodiment embeds the conductive member 30 separately in two parts in the through hole 23, whereby the fear of leaving bubbles in the conductive material becomes very small.

This embodiment uses solder balls for embedding the conductive members 30 in the through holes 23. Therefore, the solder balls can easily be arranged in the through holes 23.

This embodiment forms the plating film 25 on the electrodes 14 and metal films 24. Therefore, the conductive members 30 can be connected more securely to the electrodes 14 through the plating film 25.

In this embodiment, the through holes 23 is formed such that the diameter thereof increases as the through hole 23 extends from the principal surface S3 to the principal surface S4. This makes it easier to arrange the conductive members 30 in the through holes 23 when forming the conductive members 30. When used for embedding the conductive members 30 in the through holes 23, solder balls are stabilized in the through holes.

In this embodiment, the support substrate 20 is provided with a plurality of through holes 23, while the electrodes 14 (plating films 15) correspond to the through holes 23 individually. Therefore, when forming the conductive members 30, simply arranging solder ball members individually in the through holes 23 and reflowing them can easily make the conductive members 30 and the electrodes 14 correspond to each other.

In this embodiment, the solid-state imaging device 1 further comprises the flattening film 16 for covering the surface of the interlayer insulating layer 11f and wiring 13. Therefore, the surface of the imaging element 10 is flattened by the flattening film 16, whereby the joint between the imaging element 10 and the support substrate 20 becomes more secure.

While an embodiment of the present invention is explained in detail in the foregoing, the present invention is not limited to the above-mentioned embodiment. For example, the flattening film 16, which is flattened by CMP in the above-mentioned embodiment, is not required to be flattened by CMP when the imaging element 10 and the support substrate 20 are bonded to each other by an adhesive or the like, since the flatness required for the bonding surfaces in this case is not so high as that in the ambient temperature bonding.

The flattening film 16 disposed on the principal surface S2 of the photoelectric converter part 11 in the above-mentioned embodiment may be omitted.

The through holes 23, which is formed such that the diameter thereof increases as the through hole 23 extends from the principal surface S3 to the principal surface S4 in the above-mentioned embodiment, may have a fixed size of openings in their extending direction. The through holes 23 may narrow from the principal surface S3 to the principal surface S4.

The resin material 40 filling the interstices between the solid-state imaging device 1 and the IC chip 2 in the above-mentioned embodiment may be omitted.

While spherical solder balls are used for embedding the conductive members 30 in the through holes 23 in the above-mentioned embodiment, conductors partly having a spherical surface and those having forms other than spherical forms such as rectangular parallelepiped, tubular, cylindrical, prism, and polygonal forms, for example, can also be used While the above-mentioned embodiment is explained in terms of a CCD-type solid-state imaging device as a solid-state imaging device by way of example, it is needless to mention that the present invention is employable in various back-illuminated light-receiving element arrays such as CMOS-type solid-state imaging devices without being limited to CCD-type solid-state imaging devices.

REFERENCE SIGNS LIST

1 . . . solid-state imaging device; 2 . . . IC chip; 3 . . . electronic component; 10 . . . imaging element; 11 . . . photoelectric converter part; 14 . . . electrode; 16 . . . flattening film; 20 . . . support substrate; 23 . . . through hole; 24 . . . metal film; 25 . . . plating film; 30 . . . conductive member; 40 . . . resin material; S1, S2, S3, S4 . . . principal surface.

The invention claimed is:

1. A method for manufacturing a solid-state imaging device, the method comprising:
 a first step of preparing an imaging element including a first principal surface configured to receive an energy line incident thereon, a second principal surface opposing the first principal surface and having at least one electrode arranged thereon, and a photoelectric converter part configured to photoelectrically convert the incident energy line so as to generate a signal charge;
 a second step of preparing a support substrate, provided with at least one through hole extending in a thickness direction thereof, having third and fourth principal surfaces opposing each other;
 a third step of aligning the imaging element and the support substrate with each other so that the one electrode is exposed out of the one through hole while the second and third principal surfaces oppose each other and joining the imaging element and the support substrate to each other; and
 a fourth step of embedding a conductive member in the through hole and electrically connecting the conductive member to the electrode after the third step so that a part of the conductive member projects outside the fourth principal surface of the support substrate, wherein a surface of the part of the conductive member is a projected surface outward from the fourth principal surface;

wherein the electrode and the second principal surface of the imaging element prepared by the first step are covered with a flattening film; and wherein the flattening film is partly removed so as to expose at least a part of a surface of the electrode after the third step but before the fourth step.

2. The method according to claim 1, wherein the fourth step includes steps of arranging an electrically conductive first conductor in the through hole and melting the first conductor, so as to embed the conductive member in the through hole.

3. The method according to claim 2, wherein the first conductor is a solder ball.

4. The method according to claim 1, wherein the fourth step includes steps of arranging an electrically conductive first conductor in the through hole, melting the first conductor, then arranging an electrically conductive second conductor in the through hole, and melting the second conductor, so as to embed the conductive member in the through hole.

5. The method according to claim 4, wherein both of the first and second conductors are solder balls.

6. The method according to claim 1, wherein the electrode is formed with a plating film after the third step but before the fourth step.

7. The method according to claim 1, wherein the through hole is formed such that the diameter thereof increases as the through hole extends from the third principal surface to the fourth principal surface.

8. The method according to claim 1, wherein the through hole has an inner wall surface formed with a metal film.

9. The method according to claim 1, wherein the flattening film is constituted by TEOS.

10. The method according to claim 1, further comprising a fifth step of joining the conductive member and an electrode of an IC chip to each other by flip-chip bonding after the fourth step; and a sixth step of filling a resin material between the fourth principal surface of the support substrate and the IC chip after the fifth step.

* * * * *